United States Patent
Hokenmaier et al.

(10) Patent No.: US 11,048,583 B1
(45) Date of Patent: Jun. 29, 2021

(54) FLEXIBLE, LOW-LATENCY ERROR CORRECTION ARCHITECTURE FOR SEMICONDUCTOR MEMORY PRODUCTS

(71) Applicant: Green Mountain Semiconductor Inc., Burlington, VT (US)

(72) Inventors: Wolfgang Hokenmaier, Burlington, VT (US); Ryan A. Jurasek, Burlington, VT (US); Donald W. Labrecque, Colchester, VT (US)

(73) Assignee: Green Mountain Semiconductor Inc., Burlington, VT (US)

( * ) Notice: Subject to any disclaimer, the term of this patent is extended or adjusted under 35 U.S.C. 154(b) by 600 days.

(21) Appl. No.: 15/263,273

(22) Filed: Sep. 12, 2016

Related U.S. Application Data

(60) Provisional application No. 62/217,415, filed on Sep. 11, 2015.

(51) Int. Cl.
| | |
|---|---|
| *G11C 29/00* | (2006.01) |
| *G06F 11/10* | (2006.01) |
| *G11C 29/52* | (2006.01) |
| *G06F 3/06* | (2006.01) |

(52) U.S. Cl.
CPC .......... *G06F 11/1068* (2013.01); *G06F 3/064* (2013.01); *G06F 3/0619* (2013.01); *G06F 3/0679* (2013.01); *G11C 29/52* (2013.01)

(58) Field of Classification Search
CPC ...... G06F 11/10; G06F 11/1068; G06F 12/00; G06F 12/02; G06F 3/06; G06F 3/0619; G06F 3/064; G06F 3/0679; G11C 29/00; G11C 29/52; H03M 13/05
See application file for complete search history.

(56) References Cited

U.S. PATENT DOCUMENTS

| | | | |
|---|---|---|---|
| 5,729,497 A | 3/1998 | Pawlowski | |
| 6,070,262 A | 5/2000 | Kellogg et al. | |
| 6,185,718 B1 | 2/2001 | Dell et al. | |
| 6,584,543 B2 | 6/2003 | Williams et al. | |
| 9,684,466 B2 * | 6/2017 | Sato | G06F 11/2017 |
| 2008/0016392 A1 * | 1/2008 | Earl | G06F 11/1048 714/6.12 |
| 2009/0129173 A1 * | 5/2009 | Kajiyama | G11C 7/1039 365/189.05 |
| 2009/0164704 A1 * | 6/2009 | Kanade | G06F 11/1068 711/103 |

(Continued)

*Primary Examiner* — Albert Decady
*Assistant Examiner* — Enamul M Kabir
(74) *Attorney, Agent, or Firm* — Downs Rachlin Martin PLLC

(57) ABSTRACT

A novel architecture provides many of the advantages of the array and datapath architecture of DRAM products that do not utilize ECC (error correction code) functionality, while simultaneously allowing the flexible deployment of ECC error correction as needed. Aspects of the disclosure enable the minimization of write and read latency typically introduced by the implementation of ECC error correction. Sharing of circuit components between neighboring memory regions is also introduced, which allows for a reduction in circuit area as well as a reduction in loading on speed-critical data bus wiring, which improves overall performance. A very fast single error correct (SEC) and double error detect (DED) read-out for real-time system-level awareness is also provided.

18 Claims, 14 Drawing Sheets

(56) References Cited

U.S. PATENT DOCUMENTS

| | | | |
|---|---|---|---|
| 2011/0225475 A1* | 9/2011 | Kumar | G06F 11/1052 714/763 |
| 2012/0124448 A1* | 5/2012 | Emerson | G06F 11/1052 714/758 |
| 2013/0262958 A1* | 10/2013 | Ruggiero | G06F 11/10 714/763 |
| 2014/0283429 A1* | 9/2014 | Sullivan | F41G 11/003 42/111 |
| 2014/0337688 A1* | 11/2014 | Billing | G11C 29/42 714/764 |
| 2015/0278017 A1* | 10/2015 | Trezise | G11C 5/04 714/764 |
| 2015/0286420 A1* | 10/2015 | Crisman | G06F 3/0613 711/112 |
| 2016/0092306 A1* | 3/2016 | Benedict | G06F 11/106 714/764 |
| 2020/0278906 A1* | 9/2020 | Bains | G06F 11/1072 |

* cited by examiner

ERR0=Parity of P0, D0, D1 and D3. ERR0 can be high, indicating an error, or low, indicating no error was found.

One possible implementation is ERR0=(D0 xor D1) xor (D3 xor P0)

ERR1, ERR2 are generated the in same way using the above diagram:
ERR1= Parity of P1, D1, D2 and D3.
ERR2=Parity of P2, D0, D2 and D3.

bERR0, bERR1 and bERR2 are the inverted signals of ERR0, ERR1 and ERR2 respectively.

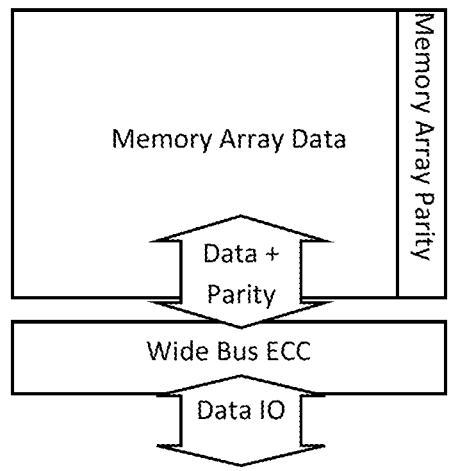
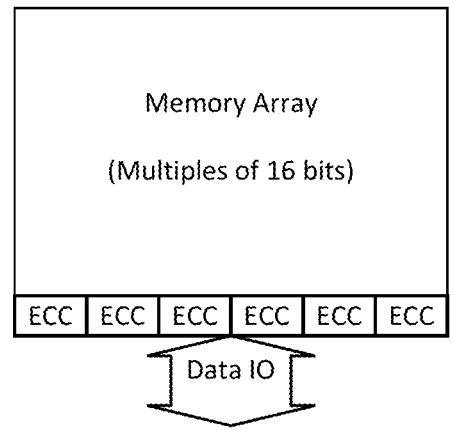
FIG. 10A
(PRIOR ART)
FIG. 10B
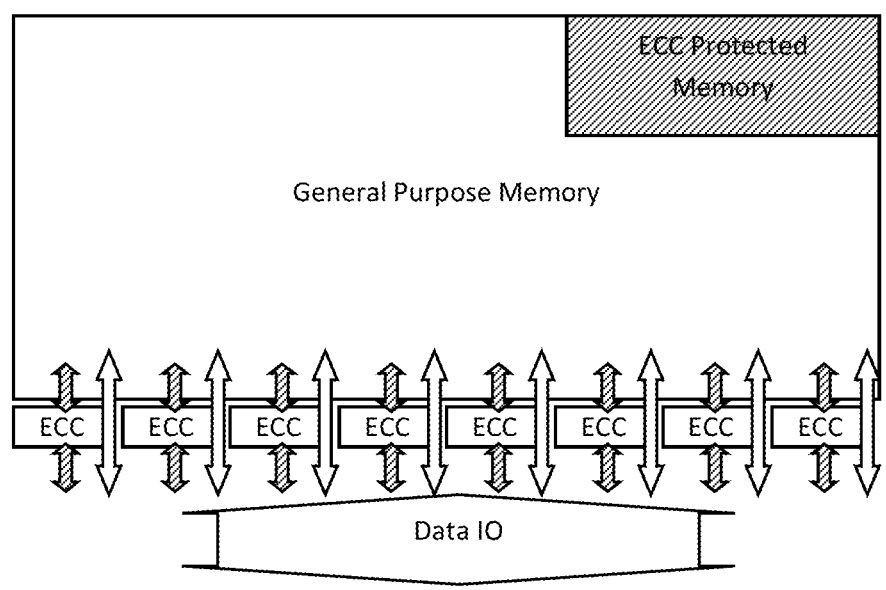
FIG. 11

FLEXIBLE, LOW-LATENCY ERROR CORRECTION ARCHITECTURE FOR SEMICONDUCTOR MEMORY PRODUCTS

RELATED APPLICATION DATA

This application claims the benefit of priority of U.S. Provisional Patent Application Ser. No. 62/217,415, filed on Sep. 11, 2015, and titled "FLEXIBLE LOW LATENCY ERROR CORRECTION ARCHITECTURE FOR SEMICONDUCTOR MEMORY PRODUCTS," which is incorporated by reference herein in its entirety.

FIELD OF THE INVENTION

The present invention generally relates to the field of semiconductor memory. In particular, the present invention is directed to a flexible, low-latency error correction architecture for semiconductor memory products.

BACKGROUND

Semiconductor memory products have a certain failure rate which cannot be reduced to zero during manufacturing tests and repair efforts. Fails can occur over the lifetime of the product either as "soft" errors caused by, for example, radiation, electromagnetic noise, variable retention effects, or temperature and voltage variations. On the other hand, "hard" errors are errors that appear over time and are permanent; these errors can be caused by, for example, defects in the material, degradation of components and electrical wiring, or mechanical stress.

The generation of an error correction code ("ECC") can help to detect errors in semiconductor memory devices and, in some instances, correct those errors. One method of producing ECCs involves including extra bits (also known as parity bits) in a data word (i.e., a fixed-size piece of data handled as a unit by the instruction set or the hardware of a computing device) to either correct or detect an error in a data word. The extra bits encoded as a function of the data bits are known as the "syndrome" of the data stored in the data bits. When a data word is read, the data and syndrome may be provided as inputs to an error correction decoder and, depending on the size of the data word and the number of parity bits used, a certain number of bits can often be corrected. It is often also possible to detect errors beyond the number of repairable errors and report such an event accordingly, although the abilities of detecting multiple errors and correcting errors can be mutually exclusive in some implementations, depending on the design of the error correction decoder.

On-die ECC for memory products has been deployed for some time. In order to minimize chip size and cost overhead, there is often a very strong, market-driven effort to minimize the amount of parity bits needed. This can result in deployment of data words in ECC implementations that have significantly more data bits than parity bits; for example, the well-known (136/128) Hamming code, which uses only 8 parity bits for 128 data bits, results in an approximate chip size increase of 6%-7% compared to an implementation that does not use ECC. Some typical disadvantage of using this type of ECC is that it can result in high latency, due to the amount of time it takes to encode and decode ECCs, the encoder and/or decoder typically require a large circuit area on a die, and there is typically associated overhead in datapath wiring and power consumption. Additional write latency is typically introduced due to the need to accommodate data masking requirements in certain common memory specifications, where additional internal reads and computations are needed before a write cycle can be executed. All of this often results in a product that is usually not drop-in compatible (i.e., not interchangeable in an existing system) with non-ECC products due to additional latency and other differences and cannot be economically sold as a non-ECC product variant due to the 6%-7% chip size overhead. However, memory products are increasingly deployed in sensitive and/or safety critical applications, such as, for example, automotive, medical, or industrial sectors, which necessitate very high accuracy and reliability and, thus, ECC.

SUMMARY OF THE DISCLOSURE

In view of the disadvantages of the prior art, the present inventors have determined that a pin-compatible and specification-compatible drop-in replacement product that offers ECC, where the ECC can be switched on and off dynamically as needed by the system, is desirable in order to improve the reliability and safety of certain applications without necessitating separate manufacture of ECC and non-ECC solutions. Also, it is useful for related systems to be aware of errors detected, whether repaired or not, in order to take appropriate action.

Accordingly, aspects of the present disclosure provide a novel architecture that has minimal impact on array and datapath architecture of non-ECC DRAM products, yet allows the flexible deployment of ECC error correction as needed and minimizes the write and read latencies related to ECC. Sharing of circuit components between neighboring memory regions is introduced, which allows for a reduction in circuit area as well as a reduction in loading on speed-critical data bus wiring, which improves overall performance. The present disclosure further introduces a very fast single error correct (SEC) and double error detect (DED) read-out for real-time system-level awareness. By utilizing a flexible ECC architecture and novel means to share certain data path circuit components between neighboring memory regions, chip size can be decreased and performance can be increased, with or without including ECC. Aspects of the present disclosure provide an architecture that minimizes chip size overhead for a standard non-ECC memory product variant while providing a small and very fast ECC solution on the same die, which can then be deployed as needed.

In one implementation, the present disclosure is directed to a semiconductor memory device. The memory device includes one or more memory arrays, error correction code (ECC) circuitry, and bypass functionality for enabling or disabling the ECC circuitry, wherein the bypass functionality is configurable such that the device can be used with or without ECC protection; a first amount of memory address space in the device is addressable by an external device when the ECC circuitry is enabled; and a second amount, larger than the first amount, of memory address space in the device is addressable by an external device when the ECC circuitry is disabled.

In another implementation, the present disclosure is directed to a semiconductor memory device. The memory device includes one or more memory arrays with shared circuitry to access a shared data bus, wherein the device has a multiplexing capability that allows for sharing of data bus drivers or receivers between two or more memory banks or portions of memory banks; a read data driver is shared between two or more memory banks or portions of memory banks; and the shared circuitry includes multiplexing circuitry operable to access different memory segments as a function of address information or data output configuration.

In yet another implementation, the present disclosure is directed to a memory device having a multitude of distributed error correction circuitry and error monitoring components, wherein error monitoring is communicated through the use of a multitude of open-drain or open-collector type connections.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 10A is a diagram illustrating a dedicated prior art ECC architecture;

FIG. 10B is a diagram illustrating a fully configurable ECC solution;

FIG. 11 is a diagram illustrating a configurable ECC allocation through configuration/mode register bit setting;

DETAILED DESCRIPTION

Shared Localized ECC Encoders/Decoders with Shared Data-Line Buffers

Figure 1:
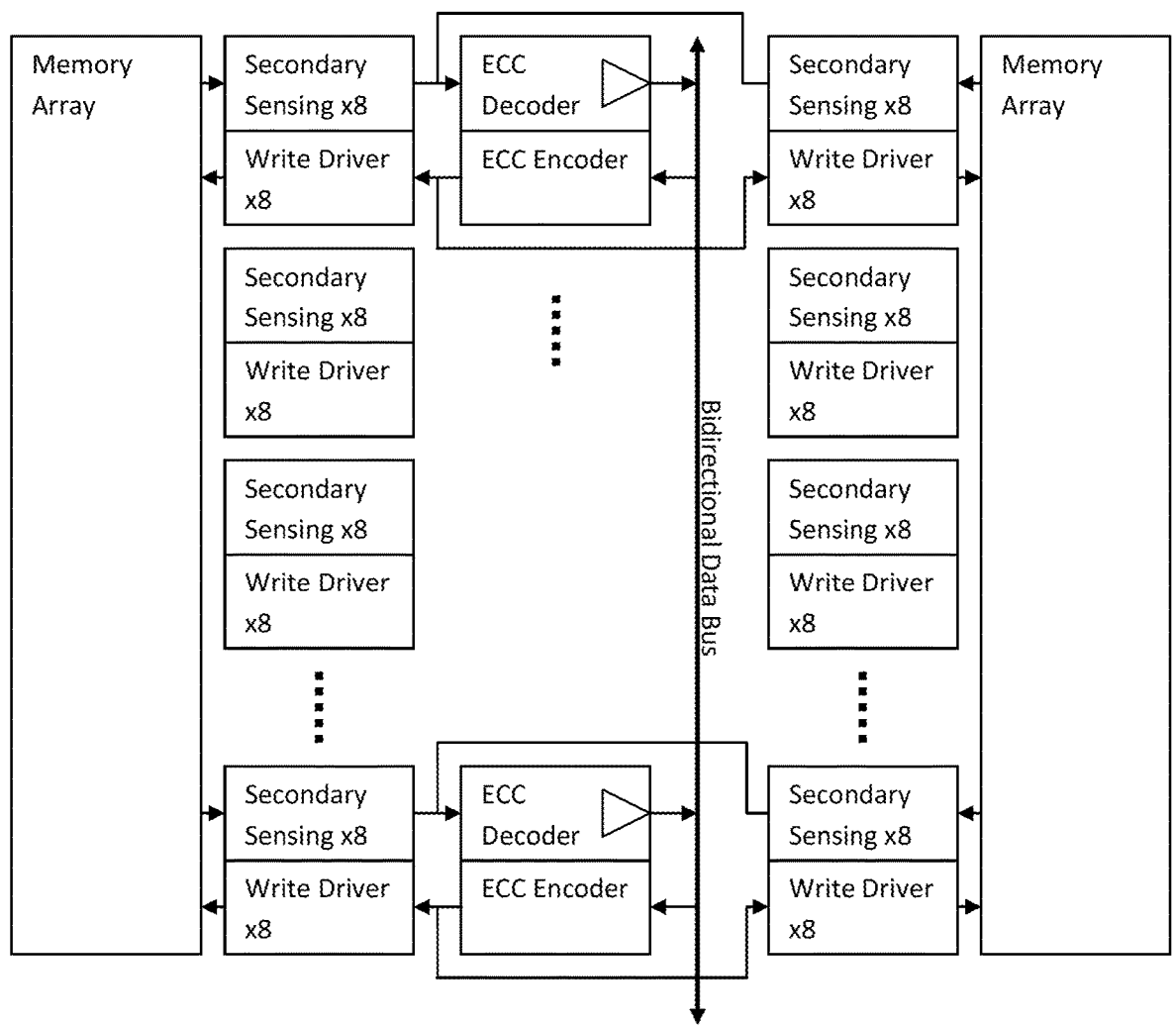
FIG. 1 is a schematic circuit diagram illustrating localized ECC encoders and decoders shared between neighboring memory banks, shared read output data drivers, and shared tap-off points from a bidirectional data bus for write operations, which improves performance due to reduced loading, the shared drivers and tap-off points being useful in both ECC and non-ECC implementations.

An ECC architecture that encodes and decodes data in close proximity to the array sensing amplifiers can eliminate the need for additional data lines, with associated reduced power consumption because fewer data lines need to be driven. The ECC decoder and encoder unit may be shared between neighboring memory banks, as shown, for example, in FIG. 1 and FIG. 2, so that only one encoder/decoder unit is needed per set of associated data lines, per shared region. This can result in reduced circuit area and reduced chip size.

The data read buffer may be shared between neighboring banks such that only one data read buffer is needed per data line, per shared region. This reduces the overall loading on the data lines, which can lead to a reduction in driver sizes needed, faster overall read speed, and reduced chip size. This solution can be used with or without ECC. Additionally or alternatively, the data write buffer may be shared between neighboring banks such that only one write buffer is needed per data line, per shared region. This can result in reduced overall loading on the data lines, smaller circuit area, faster overall write speed, and reduced chip size. In some embodiments, the number of data lines connecting to each memory bank in an ECC-capable chip can be made identical to the number of data lines needed in a non-ECC memory chip. This can reduce chip size and power consumption, as no additional ECC data lines may need to be driven for either write or read operations.

In traditional on-chip ECC solutions with wide ECC encoding/decoding (for example 72/64 ECC or 136/128 ECC), it is necessary to read data first before writing, because masked write bytes need to be taken into account to calculate the overall ECC word to be written to the memory. In the presented architecture, the granularity of the localized ECC encoder/decoder unit and the association with external data can be made small enough such that data masking poses no problems for ECC write operations. For example an (8/4) Hamming code will write only four data bits (8 bits total) to the memory location, and these four bits are associated to bits within a byte controlled by one data masking bit. Therefore, the write for the entire encoder/decoder unit may be either performed as normal or inhibited and no reads are necessary. This has a significant performance advantage especially for memory interface specifications that do not allow any de-rating of write performance for data mask write operations.

ECC/Non-ECC Combination Chip

Figure 3:
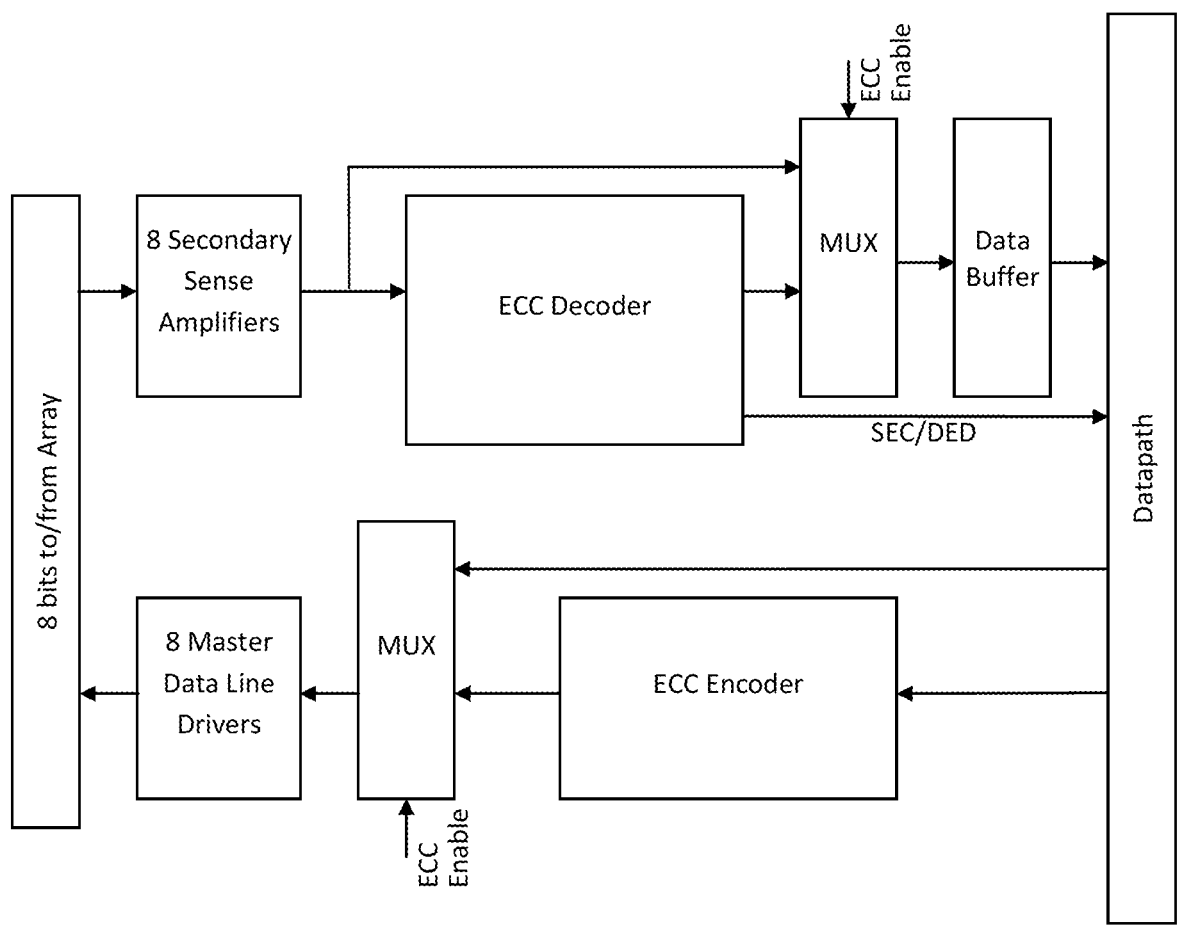
FIG. 3 is a schematic circuit diagram illustrating a Hamming Code (8/4) encoder/decoder unit with bypass functionality operable to enable and disable ECC functions.
Figure 4:
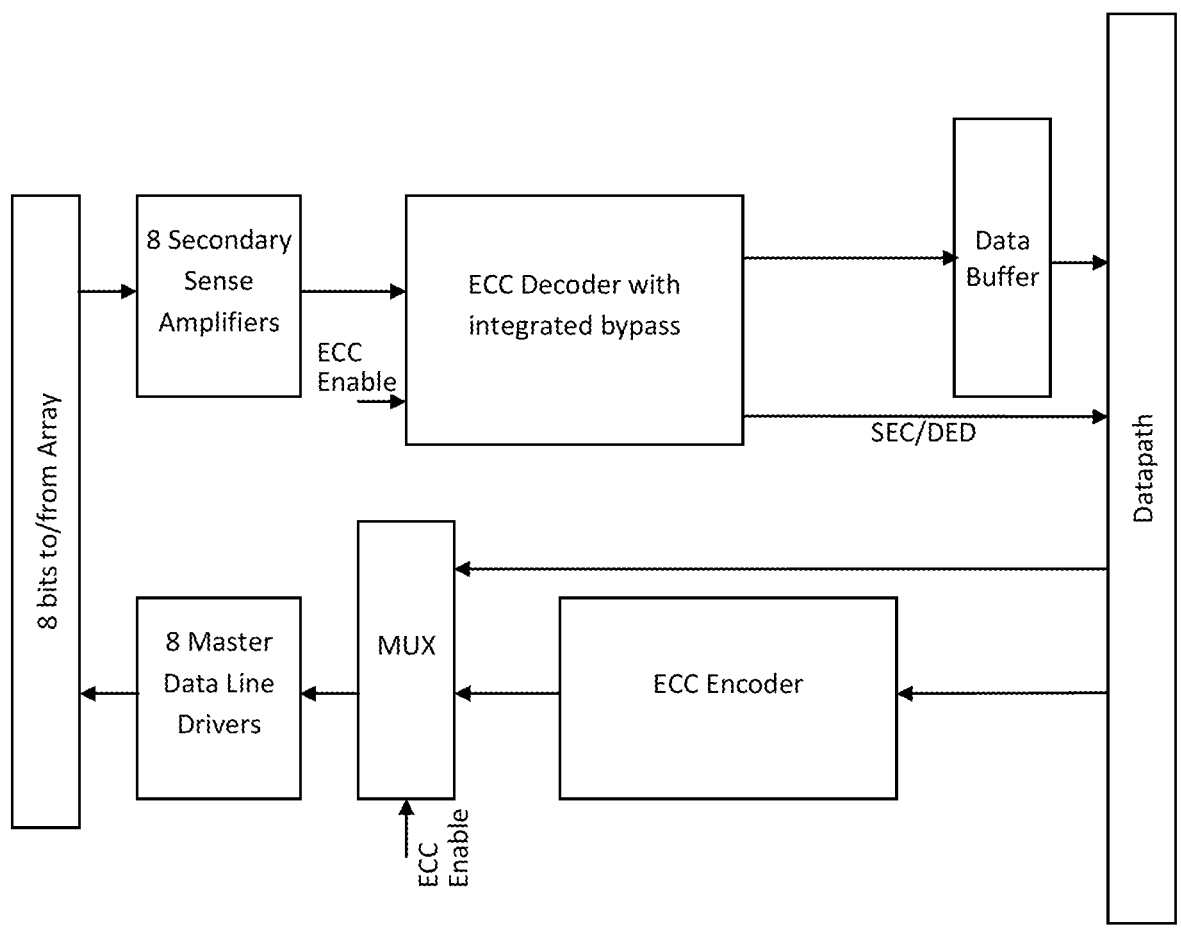
FIG. 4 is a schematic circuit diagram illustrating a Hamming Code (8/4) encoder/decoder unit, where the decoder has a built-in bypass feature ("smart" bypass) that enables a faster overall read path.
Figure 5:
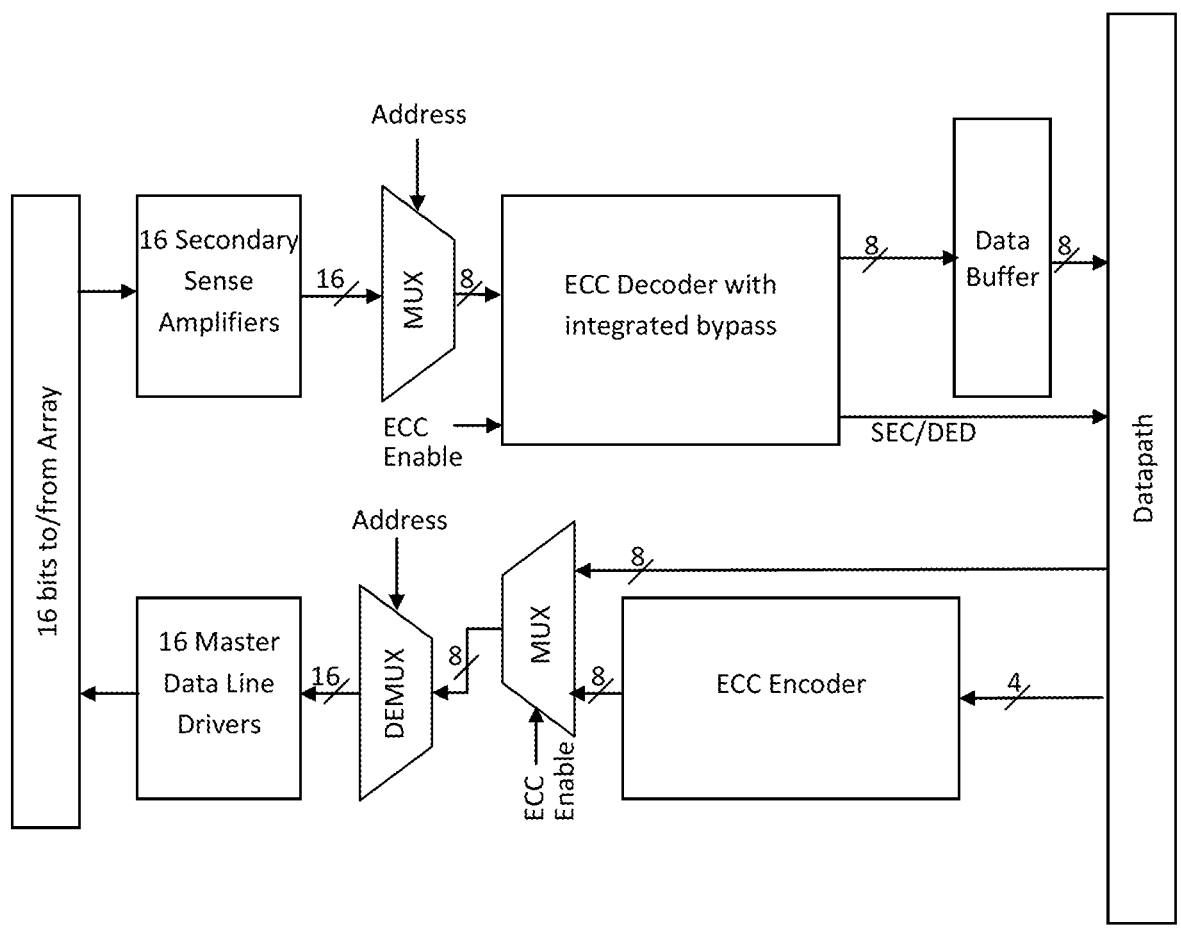
FIG. 5 is a schematic circuit diagram illustrating a Hamming Code (8/4) encoder/decoder unit having additional multiplexing/demultiplexing capability to serve neighboring memory segments, as shown in FIG. 2.
Figure 6:
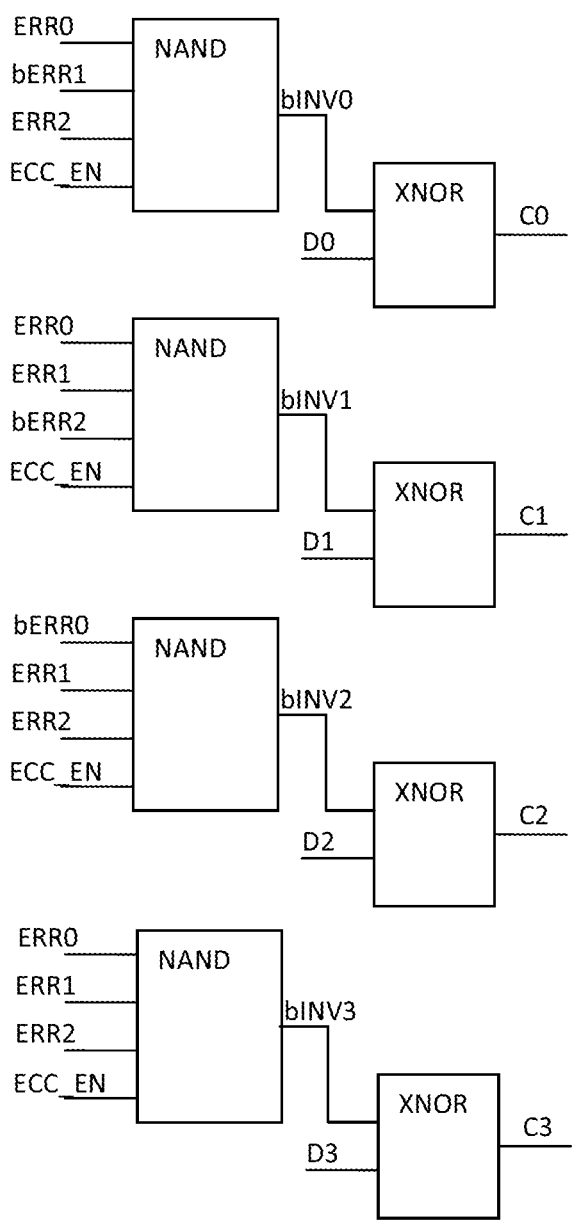
FIG. 6 is a schematic circuit diagram illustrating a Hamming Code (7/4) decoder with integrated bypass feature for non-ECC operation, where ERR0, bERR0, etc., are all generated through well-known XOR operations out of D0 . . . D3 and P0 . . . P2.
Figure 6:
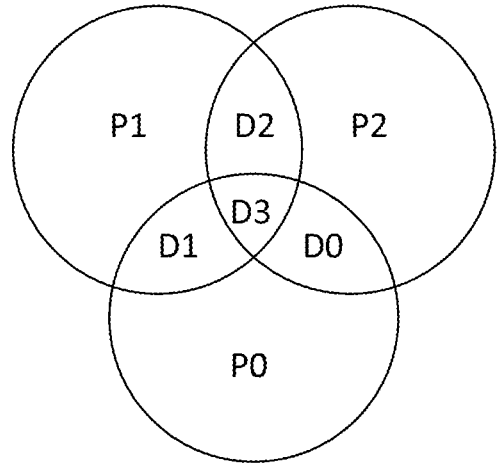
Figure 7:
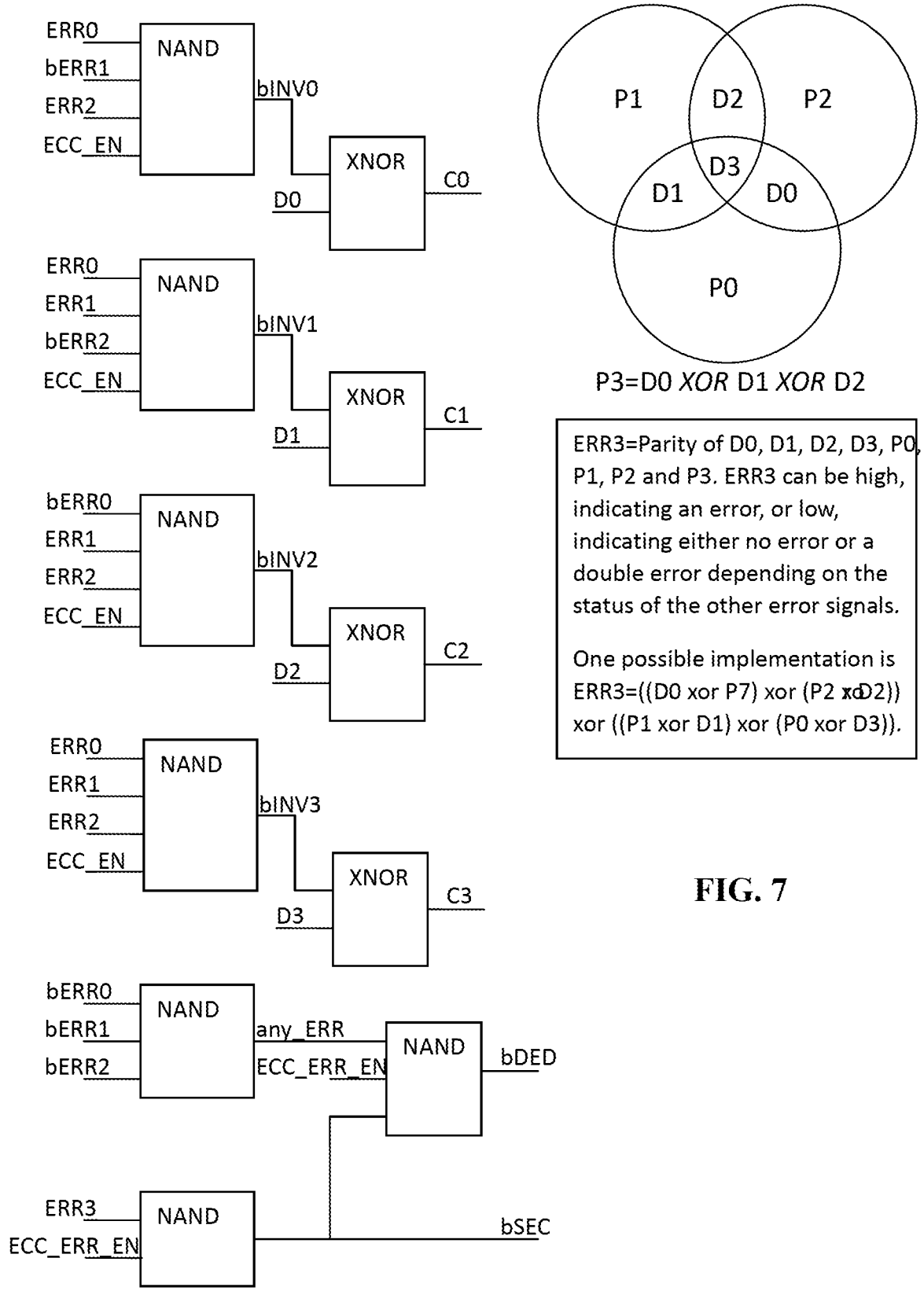
FIG. 7 is a schematic diagram illustrating a Hamming Code (8/4) decoder with integrated bypass feature and single-error correcting and double-error detecting (SECDED) outputs.

An ECC architecture like one of those shown in FIGS. 3-5 can allow for both ECC-capable and non-ECC-capable (or hybrid, i.e., partially ECC-capable and partially non-ECC-capable on an address-, bit-, or time-dependent basis) products from the same chip design. The ECC decoders and encoders can be bypassed using such an architecture, allowing for a non-ECC product with up to 2× available memory density, a reduced memory density but with the advantage of ECC error correction, or a hybrid implementation that takes advantage of ECC functionality for some data bits or some periods of time while still leaving more memory available for use, at least during certain periods of time, than an implementation that uses ECC for each data bit.

The bypass control can be made fully programmable through control signals, which can be modified permanently through means like mask options, laser fuses, electrical fuses, and/or can be modified during operation by means including mode register write operations and/or other external commands. The bypass control can be enabled or disabled partially, such as to allow for easy diagnostic and verification of the ECC functionality and for memory array testing.

FIGS. 4-7 show smart bypass features that eliminate the need for a separate read data multiplexer and instead allow for bypassing the read data within the ECC decoder. This can result in improved read performance with ECC enabled due to the elimination of extra gates in the read path. With ECC disabled, the gate delay is only two gates, which is on par with a typical separate multiplexer.

FIGS. 10A and 10B show a comparison of a typical state of the art on-die ECC architecture (FIG. 10A) to a currently preferred embodiment of the present disclosure (FIG. 10B). The memory array in FIG. 10B has no dedicated parity memory array and therefore does not have the fixed area overhead of the state of the art architecture. Instead, the amount of parity used is configurable, from none at all (ECC bypass activated at all times) to 50% of the memory area in case of (8/4) Hamming code.

FIG. 11 shows that memory configurations implemented in accordance with the teachings of the present disclosure can be made configurable, at the time of manufacture and/or during operation of the device, such that a portion of the memory uses ECC whereas another portion of the memory does not. Hence, critical data can be stored in ECC-protected memory locations, whereas less critical data can be stored in memory locations where ECC is not used and therefore the amount of memory available is greater, due to the avoidance of parity bits for this section of memory and the resulting increase in available data bits. This configurability can be in the form of fuses, mask options, and/or bond options for permanent memory allocation and/or can be made user configurable through mode register bit combinations and/or other external commands. The configuration shown can dedicate certain memory address locations to be used with ECC encoders/decoders active, while other memory locations may enable the bypass of the ECC decoders and encoders, hence enabling utilization of one or more memory locations for data that would have otherwise been used for ECC due to the reduction in parity bit overhead. The configuration can be performed at the initialization sequence typical for modern advanced memory products and then remain static during the run-time of the product. Additionally or alternatively, the memory allocation between ECC and non-ECC portions can be changed during the run-time of the product in order to accommodate changing memory needs. For example, a medical software application may demand a large portion of available memory to be ECC-protected for patient data storage, whereas a web browser app may subsequently re-allocate memory without ECC usage in order to be able to store more data.

ECC Data Multiplexing Circuits

Figure 2:
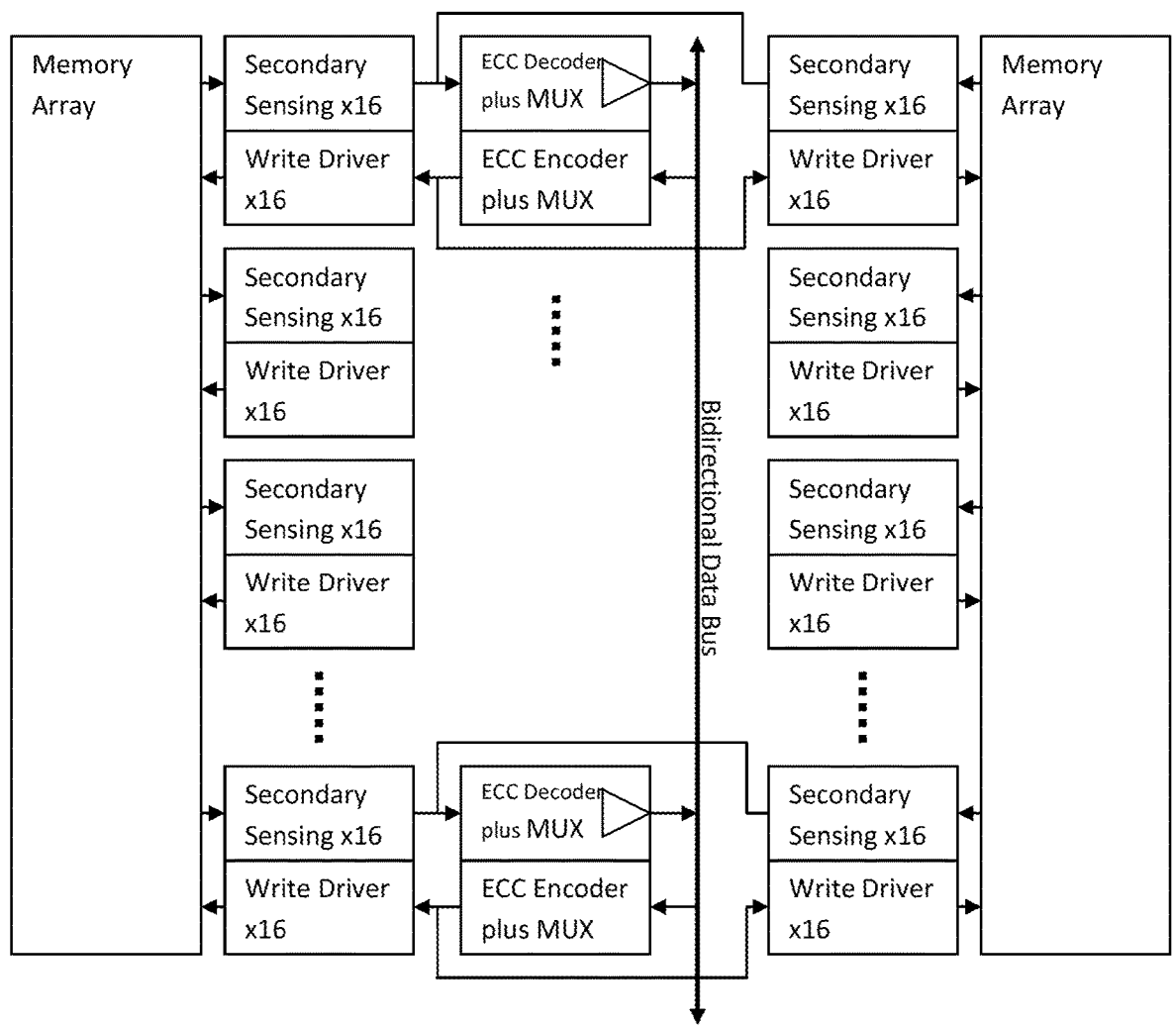
FIG. 2 is a schematic circuit diagram illustrating localized ECC encoders and decoders with additional multiplexing circuitry enabling a multitude of read/write drivers to be accessed, which reduces the amount of ECC decoder/encoder segments needed and further reduces the amount of drivers and tap-off points loading the bidirectional data bus.

The ECC circuit encoder and decoder circuits and related architecture can be designed such that data can be multiplexed to perform read and write operations to and from multiple potential memory locations. This reduces the amount of ECC encoder and decoder circuits needed per chip. It also allows the numbers of data line drivers and data line tap-off points to be reduced, therefore reducing loading on the data bus and increasing the overall performance. FIG. 2 and FIG. 5 illustrate how multiple memory segments are able to share common circuitry. Notably, to maintain clarity in the drawing, the data connections to neighboring banks illustrated in FIG. 2 are not illustrated in FIG. 5 although they would still be present in such an implementation.

Real-Time SECDED Error Read-Out

Figure 8:
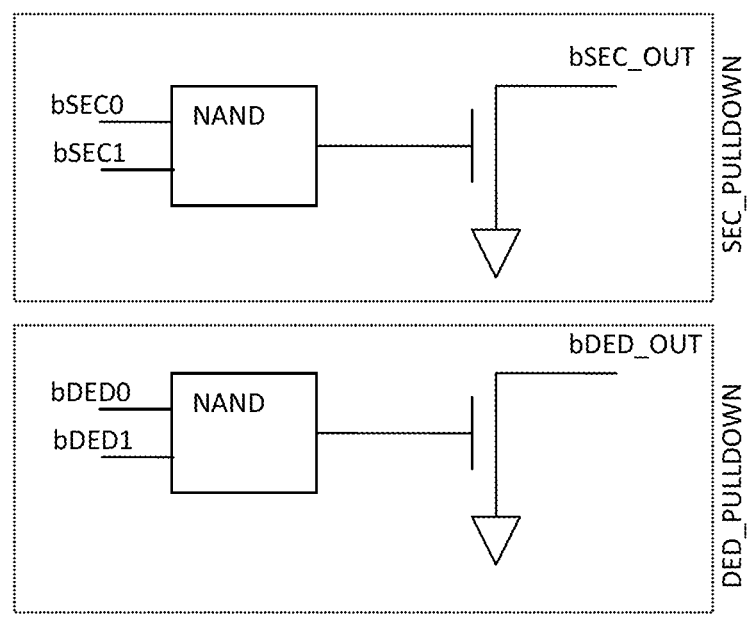
FIG. 8 is a schematic circuit diagram illustrating an open drain error output where one open drain transistor is utilized per two neighboring decoder units, per error information, which reduces loading on the error output signals (bSEC_OUT and bDED_OUT)
Figure 9:
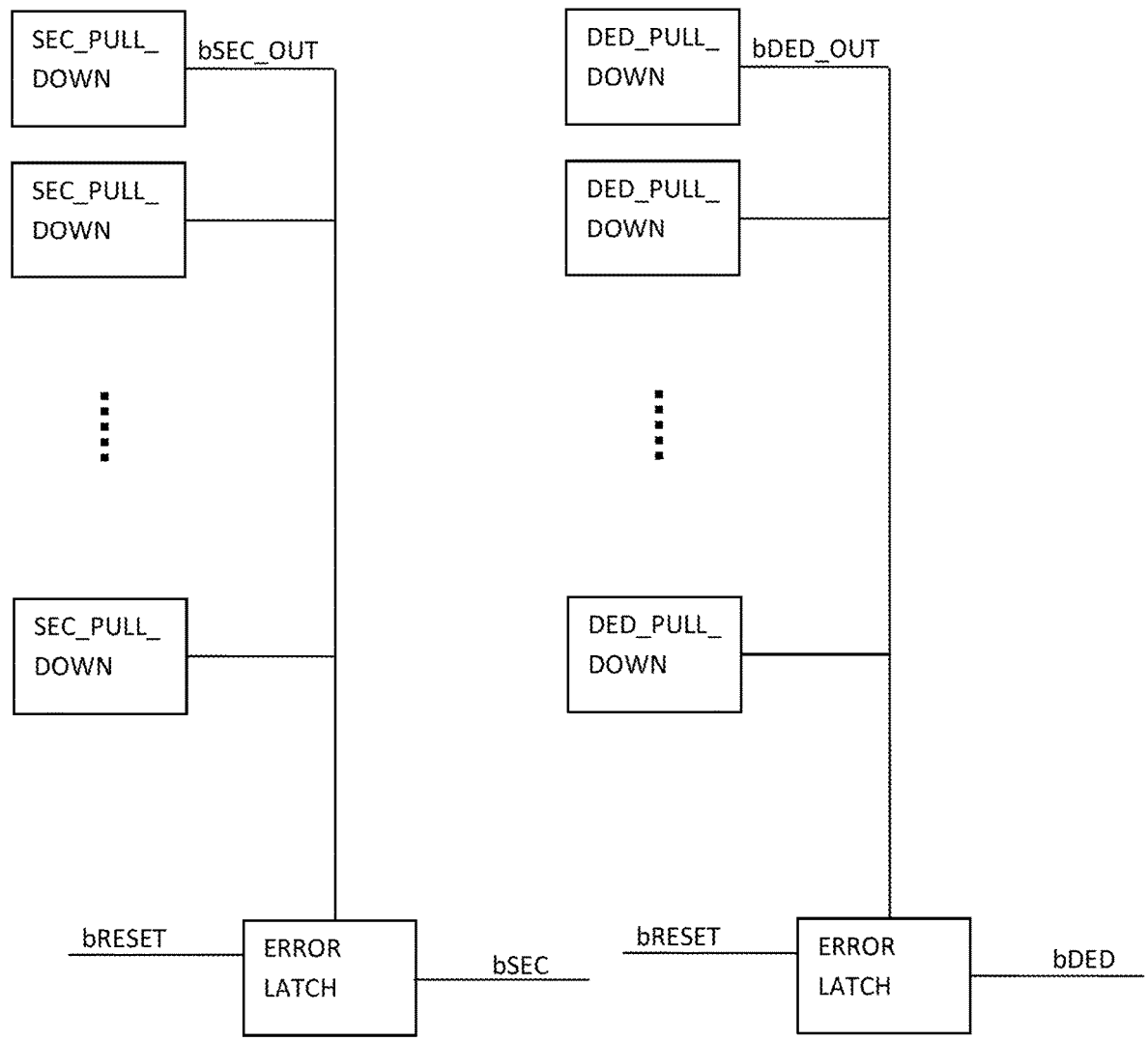
FIG. 9 is a schematic circuit diagram illustrating multiple open-drain error output circuits like the "SEC_PULL_DOWN" or "DED_PULL_DOWN" circuits of FIG. 8 that are wired together and connected to a respective error latch, which is periodically reset to a known state and can then be altered during read events by one or multiple instances of error output circuits, enabling the output error information (bSEC and bDED) to be further processed, combined with other error information signals, and sent to mode register latches or output to one or multiple error information output drivers.

Error information is typically reported per decoder unit with one bit for single error correct (SEC) events and one bit for double error detect (DED) events. These error bits could be treated like regular data, but this would increase the number of data line outputs from, e.g., 4 to 6 in the case of Hamming code (8/4). In order to reduce the number of data lines needed, it is possible to perform a logical "OR" on error bits from different decoder regions when specific error location information is not needed. A daisy-chained OR arrangement can uses just one wire for a multitude of serially aligned decoder segments. However, such an implementation would be very slow compared to the speed of the data lines. In order to eliminate this disadvantage, the present inventors discovered that an open-drain pull-down output may be used for each decoder error bit (see, e.g., FIGS. 8 and 9), where one single wire is shorted to a multitude of such open-drain outputs (e.g., eight or sixteen decoders per latch structure for each branch of data lines; multiple latch structures may be present and combined using conventional logic) in such a way that a latch, which may be precharged to a high voltage before the read event, can be pulled down to ground if any error is detected by the respective decoder. This significantly reduces the speed of the logical OR while maintaining the single wire architecture. For example, a data bus of 128 data bits may have only one SEC and one DED wire connected to multiple open drain outputs and one data latch located closest to where the error information is needed, where it may be processed further with normal complementary logic gates.

Figure 12:
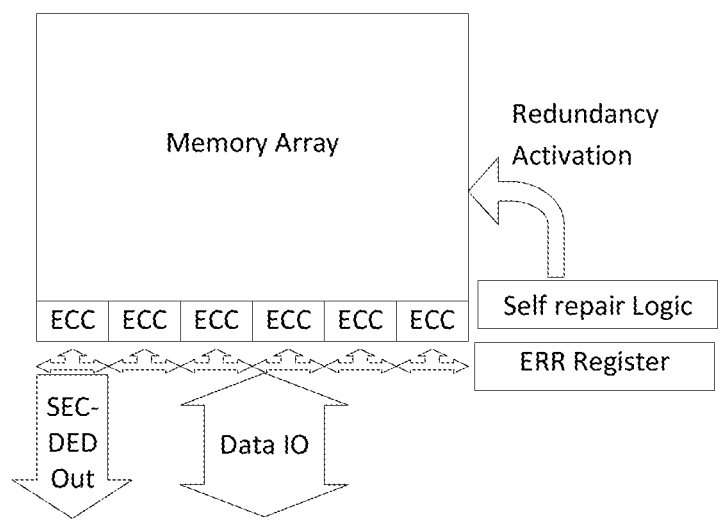
FIG. 12 is a diagram illustrating how error information can be output to external pins and/or latched internally to be read through mode register read commands, where error information can include address information for an error that can be used for temporary or permanent repair of any address having an error or multiple errors.
Figure 13:
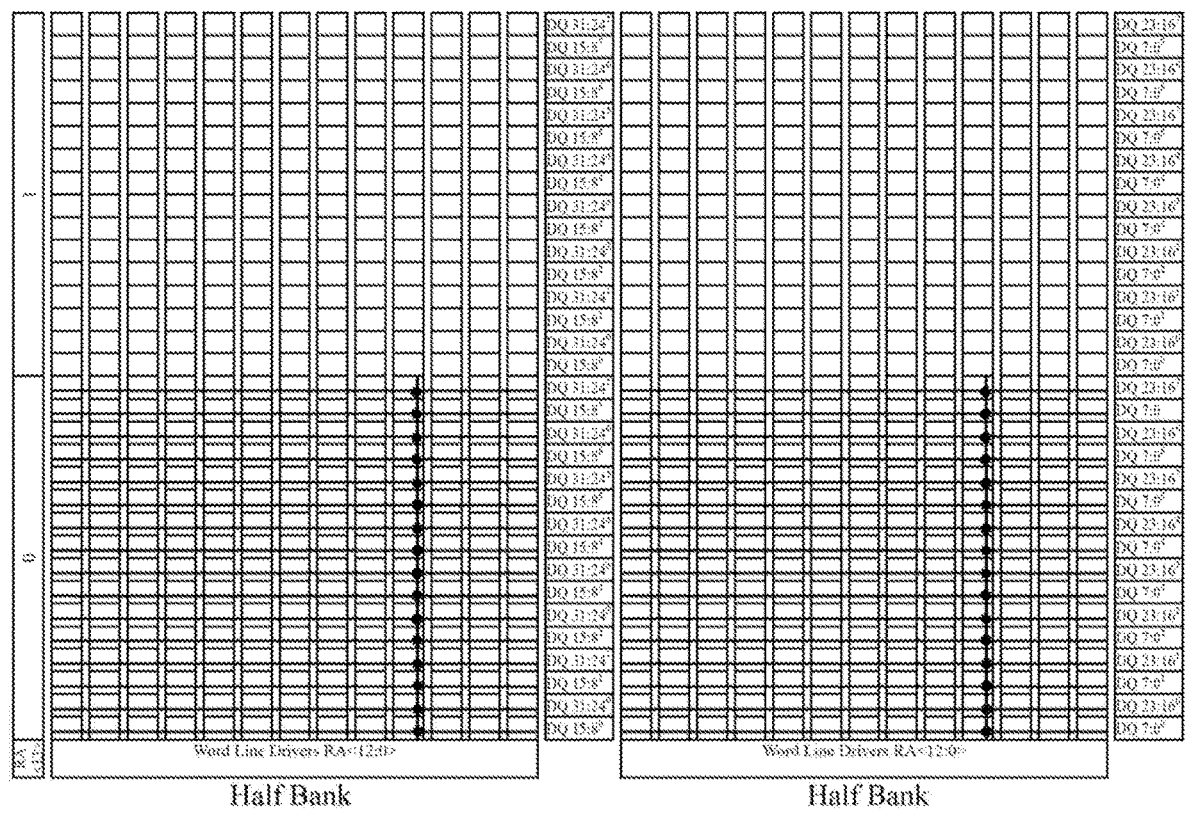
FIG. 13 is a diagram of a memory bank and its x32 DQ assignment without use of ECC; note that there is one more address RA<13> compared to the version with ECC enabled; the "half banks" shown are not physically adjacent: rather each DQ region, which contains Read/Write and ECC circuitry, is adjacent to another bank's half bank such that the read/write and ECC circuitry can be shared with this other bank; word lines are shown vertically (one per half bank); column select lines are shown horizontally, sixteen per half bank without ECC; each crossover between word line and column select line yields eight data bits for 256 data bits in total, with 32 DQ Input/Output pads and a so called 8-bit prefetch for a burst length of eight.
Figure 14:
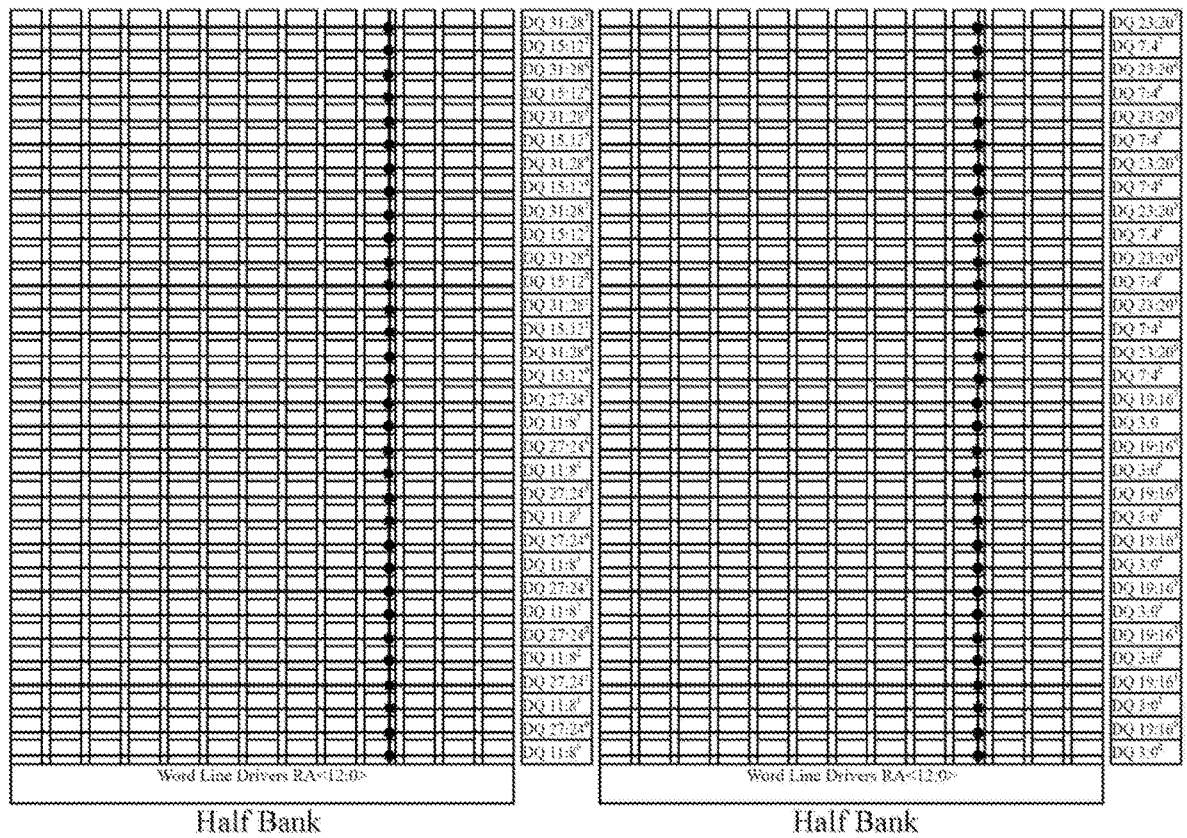
FIG. 14 is a diagram of a memory bank and its x32 DQ assignment with use of ECC; note there is one less row address compared to the version with ECC disabled shown in FIG. 13; word lines are shown vertically (one per half bank); column select lines are shown horizontally, 32 per half bank with ECC; each crossing between word line and column select line yields four data bits and 3 or 4 parity bits depending on the Hamming code used; the ECC decoders reduce this to 4 corrected data bits each, for a total of 256 data bits, assuming 32 DQ Input/Output pads and an eight bit data prefetch; alternatively, the address which is eliminated may also be a column address instead of a row address.
Figure 15:
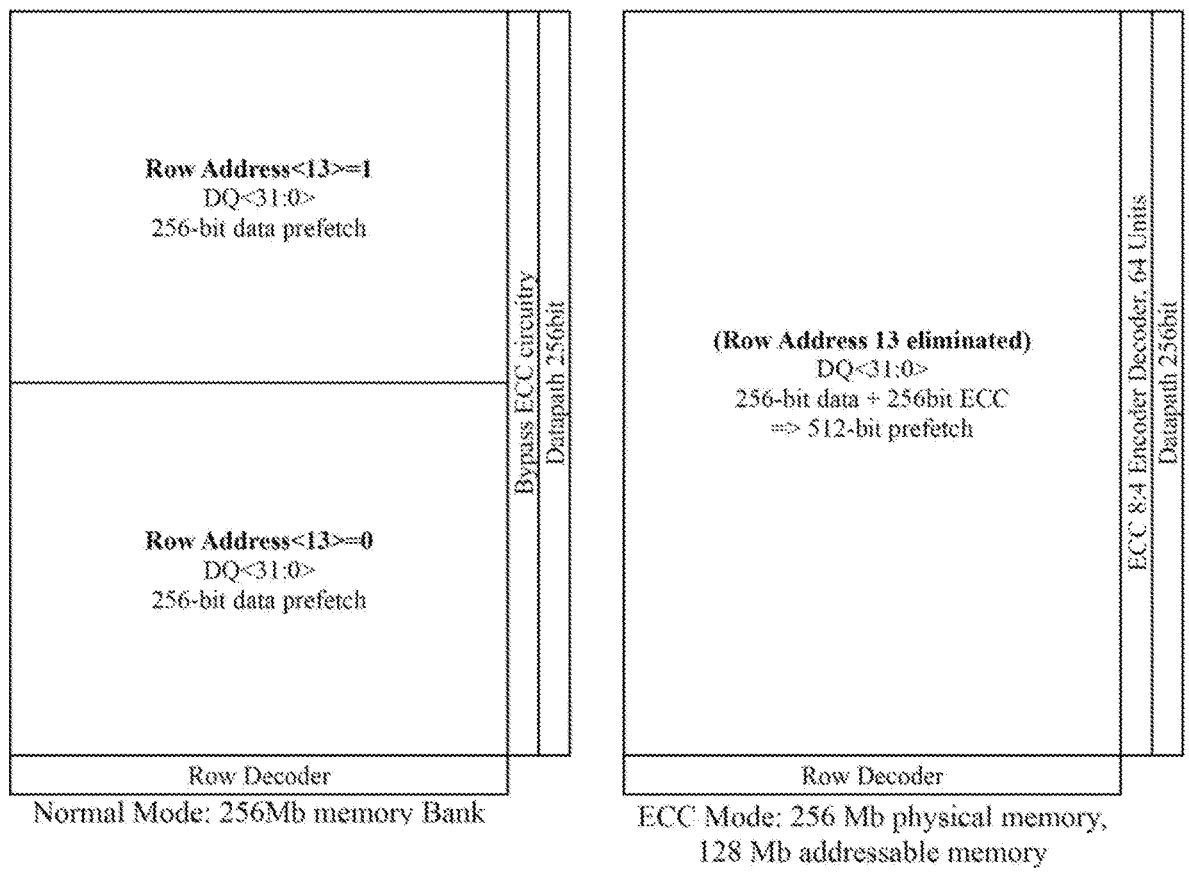
FIG. 15 further illustrates the changes in data allocation and address space between ECC usage and non-usage as seen in the examples of FIGS. 13-14; note how the data bus is unchanged in length, here at 256 bits, even if as much as 512 bits are read from the array in ECC mode; this reduces power consumption and chip area consumed by the data bus, compared to prior art ECC data path architectures which increase the data path to accommodate for parity bits; note also that hybrid memory usage is possible, where the extra row or column address is present for some of the overall address space, but not for the ECC-protected address space; in the example of FIG. 15, the resulting available memory for the user (e.g., memory addressable by an external device) from this bank can be anywhere from 128 Mb to 256 Mb or almost any number in between, due to the flexible deployment of ECC usage and ECC bypass.

Simulations executed by the present inventors show that the open drain error reporting architecture can enable real-time error read-out with latency similar or identical to non-ECC memory data. This can be useful for safety critical applications where immediate, appropriate action to detected memory integrity issues may be needed. The low latency error information is further useful for accurately latching error address information, which may otherwise be lost or uncertain (e.g., for slow, transitioning signals) in terms of the association between the error event and the correct address due to consecutive commands altering the information. If the error address can be stored accurately it opens the possibility to perform temporary or permanent repairs to affected address locations (see, e.g., FIG. 12). Repairs may be performed by redirecting read and write accesses to any address found to be defective to an address of spare memory (assuming spare memory addresses are available), which in some embodiments may be performed within a device in a transparent fashion such that errors can be corrected during memory refresh or other operations that are executed within the memory without external systems ever being exposed to such errors or even the fact any errors occurred. Temporary repairs may use latches that lose their information when power is lost to the device, while permanent repairs may avoid this by utilizing a permanent memory device, such as electrical fuses and/or other types of non-volatile memory.

Alternative Embodiments

The foregoing has been a detailed description of illustrative embodiments of the invention. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A memory device comprising one or more memory arrays, on-die error correction code (ECC) circuitry, and on-die bypass functionality for enabling or disabling the ECC circuitry, wherein:
   the bypass functionality is configurable such that the device can be used with or without ECC protection;
   a first amount of memory address space in the device is addressable by an external device when the ECC circuitry is enabled; and
   a second amount, larger than the first amount, of memory address space in the device is addressable by an external device when the ECC circuitry is disabled;
   wherein the on-die ECC circuitry includes a plurality of encoder/decoder units communicatively coupled to corresponding memory address locations, the encoder/decoder units including a user-configurable ECC bypass for selectively bypassing or enabling a corresponding encoder/decoder unit, wherein when the encoder/decoder unit is bypassed, a first portion of memory address locations become addressable by the external device,
   wherein the one or more memory arrays have shared circuitry to access a shared data bus,
   wherein:
   the device has a multiplexing capability that allows for sharing of data bus drivers or receivers between two or more memory banks or portions of memory banks;
   a read data driver is shared between two or more memory banks or portions of memory banks; and
   the shared circuitry includes multiplexing circuitry operable to access different memory segments as a function of address information or data output configuration.

2. The memory device of claim 1, wherein the bypass functionality can be configured to simultaneously use a first portion of the memory address space in the device for the ECC circuitry or data that is processed by the ECC circuitry, and a second portion of the memory address space for data that is not processed by the ECC circuitry, the on die bypass functionality configured to selectively and dynamically vary a size of the first and second portions of memory address space by controlling the number of the plurality of encoder-decoder units that are bypassed and the number of encoder-decoder units that are enabled.

3. The memory device of claim 2, wherein the overall available memory address space changes depending on the amount of ECC memory used, from a larger amount when ECC is completely disabled to a smaller amount if ECC is enabled for the entire device.

4. The memory device of claim 1, wherein a read bypass function is integrated into the error correction code circuitry.

5. The memory device of claim 1, wherein the bypass functionality is configurable to cause at least a portion of the device to permanently bypass the error correction code circuitry.

6. The memory device of claim 1, wherein the bypass functionality is configurable to cause at least a portion of the device to permanently utilize the error correction code circuitry.

7. The memory device of claim 1, wherein the bypass functionality is configurable to cause one or more but less than all of a number of potential data bits in the device to be subject to the error correction code circuitry.

8. The memory device of claim 1, wherein a state of the bypass functionality is permanently set at the time of manufacture.

9. The memory device of claim 1, wherein a state of the bypass functionality can be dynamically configured during operation of the device.

10. The memory device of claim 9, wherein the number and location of bits subject to error correction can be dynamically configured during operation of the device and the number of bits subject to error correction can be dynamically changed from a first amount to a second amount that is less than the first amount and greater than zero.

11. The memory device of claim 1, wherein the shared circuitry includes the ECC circuitry.

12. The memory device of claim 11 wherein the error correction circuitry contains at least one ECC encoder or at least one ECC decoder.

13. The memory device of claim 1, wherein the memory device has a multitude of distributed error correction circuitry and error monitoring components, wherein error monitoring is communicated through the use of a multitude of open-drain or open-collector type connections.

14. The memory device of claim 13, wherein an error monitor signal is initially set to a high voltage and, when an error is detected, the error monitor signal is pulled to a lower voltage by an open drain n-FET type transistor or an open-collector NPN-type transistor.

15. The memory device of claim 13, wherein the error monitor signal is initially set to a low voltage and, when an error is detected, the error monitor signal is pulled to a higher voltage by an open drain p-FET type transistor or an open-collector PNP-type transistor.

16. The memory device of claim 13, wherein information generated by the device regarding repairable or non-repairable errors results in storage of related address information.

17. The memory device of claim 16, wherein the related address information is used to perform temporary or permanent repairs to the memory.

18. The memory device of claim 1, wherein the memory device is configured to communicate with an external device over an input/output data bus, wherein a width of the data bus remains the same and is not affected by the enabling or disabling of the ECC circuitry, wherein when one of the encoder/decoder units is bypassed, the first portion of memory address locations become addressable by the external device via the input/output data bus.

* * * * *